United States Patent
Cho

(10) Patent No.: US 9,052,364 B2
(45) Date of Patent: Jun. 9, 2015

(54) APPARATUS FOR DIAGNOSING RELAY CONTACT OF ELECTRIC VEHICLE AND METHOD THEREOF

(71) Applicant: LSIS CO., LTD., Anyang-si, Gyeonggi-do (KR)

(72) Inventor: Duk Yun Cho, Suwon-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 264 days.

(21) Appl. No.: 13/893,234

(22) Filed: May 13, 2013

(65) Prior Publication Data

US 2013/0314012 A1 Nov. 28, 2013

(30) Foreign Application Priority Data

May 22, 2012 (KR) ........................ 10-2012-0054264

(51) Int. Cl.
  *H01H 47/00* (2006.01)
  *G01R 31/327* (2006.01)
  *H02P 6/00* (2006.01)
  *G01R 31/00* (2006.01)

(52) U.S. Cl.
  CPC .......... *G01R 31/3278* (2013.01); *G01R 31/007* (2013.01); *H02P 6/001* (2013.01)

(58) Field of Classification Search
  USPC ............................ 318/490, 558; 324/418–423
  See application file for complete search history.

(56) References Cited

U.S. PATENT DOCUMENTS

| | | | | |
|---|---|---|---|---|
| 3,619,768 | A * | 11/1971 | Harte | 324/422 |
| 5,677,839 | A | 10/1997 | Kondo | |
| 5,748,427 | A * | 5/1998 | Yerkovich et al. | 361/92 |
| 6,909,285 | B2 * | 6/2005 | Jordan et al. | 324/382 |
| 7,403,368 | B2 * | 7/2008 | Johnson, Jr. | 361/157 |
| 8,339,761 | B2 * | 12/2012 | Yamada et al. | 361/160 |
| 8,699,201 | B2 * | 4/2014 | Kohri et al. | 361/187 |

FOREIGN PATENT DOCUMENTS

| | | |
|---|---|---|
| CN | 101201390 | 6/2008 |
| CN | 101609127 | 12/2009 |
| CN | 201364376 | 12/2009 |
| CN | 101625395 | 1/2010 |
| CN | 102004222 | 4/2011 |
| CN | 102175971 | 9/2011 |
| CN | 102269790 | 12/2011 |

(Continued)

OTHER PUBLICATIONS

Korean Intellectual Property Office Application Serial No. 10-2012-0054264, Notice of Allowance dated Oct. 29, 2013, 2 pages.

(Continued)

*Primary Examiner* — Bentsu Ro
(74) *Attorney, Agent, or Firm* — Lee, Hong, Degerman, Kang & Waimey

(57) ABSTRACT

Disclosed are an apparatus for diagnosing a relay contact of an electric vehicle and a method thereof. The method includes measuring a first voltage input from a high-voltage battery to an inverter; comparing the first voltage with a second voltage output through the high-voltage battery; identifying a detection time point of the first voltage when the first voltage is greater than the second voltage; and determining whether a high-voltage relay, which intermits an output voltage of the high-voltage battery, is malfunctioned based on the identified detection time point.

13 Claims, 6 Drawing Sheets

(56) References Cited

FOREIGN PATENT DOCUMENTS

| | | |
|---|---|---|
| EP | 563683 | 10/1993 |
| JP | 57-26767 | 2/1982 |
| JP | 10-144194 | 5/1998 |
| JP | 2007-159326 | 6/2007 |
| JP | 2009-234559 | 10/2009 |
| JP | 2011-109872 | 6/2011 |
| KR | 10-0829307 | 5/2008 |
| KR | 10-0867834 | 11/2008 |
| KR | 10-2011-0062136 | 6/2011 |

OTHER PUBLICATIONS

Japan Patent Office Application Serial No. 2013-106971, Office Action dated Mar. 10, 2014, 2 pages.

The State Intellectual Property Office of the People's Republic of China Application Serial No. 201310192659.7, Office Action dated Mar. 31, 2015, 7 pages.

\* cited by examiner

APPARATUS FOR DIAGNOSING RELAY CONTACT OF ELECTRIC VEHICLE AND METHOD THEREOF

CROSS-REFERENCE TO RELATED APPLICATIONS

Pursuant to 35 U.S.C. §119 (a), this application claims the benefit of earlier filing date and right of priority to Korean Patent Application No. 10-2012-0054264, filed on May 22, 2012, the contents of which are hereby incorporated by reference in their entirety.

BACKGROUND

The embodiment relates to a diagnostic apparatus connected to an inverter for an electric vehicle. More particularly, the embodiment relates to an apparatus for diagnosing a relay contact, which is installed at a power line connected to a motor controller to diagnose fusion of a high voltage relay contact that switches a main power source on or off, and a method thereof.

An inverter serving as a motor controller employed in an eco-friendly vehicle is an electric/electronic sub-assembly (ESA) to convert high-voltage DC power into AC power or DC power for the purpose of controlling a motor. The inverter is a main component serving as an electric driving device of a vehicle.

In such an eco-friendly vehicle, a high-voltage relay is connected to a power line for each motor and each motor controller including an inverter such that the high-voltage relay switches on or off of the battery serving as a main power source. The high-voltage relay is equipped with an emergency operation control function for driving a vehicle through the motor and the power cutoff function even when an emergency operation is performed caused by the failure of two motors and two motor controller from among three motors and three motor controllers.

That is, when dielectric breakdown or a problem occurs in an IGBT (Insulated Gate Bipolar Transistor), which is an inverter included in the motor controller, due to an overvoltage or overcurrent while the vehicle is being operated, the high-voltage relay connected to the power line cuts off the power being supplied to the corresponding motor and motor controller and performs an emergency operation using other motors and motor controllers which remain in a normal state.

Since large current flows bilaterally through the high-voltage relay which controls the power supply to the motor and the motor controller, the possibility of the fusion of the high-voltage relay is very high due to a temperature increase and a fault component. Since it is impossible in the fusion state to cut off the power supply to the motor and the motor controller subject to troubles, the counter electromotive force generated due to the rotation of the motor having the trouble exerts effect on other normal motors and motor controller so that a continuous current flow occurs.

FIG. 1 is a flowchart illustrating a method of diagnosing a relay contact point according to the related art which is disclosed in Korean Patent Application No. 10-2009-0118728.

Referring to FIG. 1, in a state that a fuel cell vehicle is operated in step S101, it is determined in step S102 whether a fuel cell stack is normally shut down in response to a stop of the vehicle.

In step S102, if the fuel cell stack is normally shut down, a main controller primarily turns off the first to third relays Ry1, Ry2 and Ry3 such that the output powers of the fuel cell stack and the super capacitor are primarily shut down and then turns off the fourth relay which is a high-voltage relay, so that the power supply to the motor controller is blocked.

In this case, although a periphery complementary apparatus blocks the hydrogen supplied to the anode of the fuel cell stack and supplies oxygen to remove residual hydrogen, since power is not normally supplied, energy of an internal capacitor C is used to drive the periphery complementary apparatus so that a voltage variation occurs.

In addition, if the power supplied to the motor controller is shut off as the fourth relay Ry4 is turned off, a voltage drop of a capacitor C1 is constantly caused by an internal resistance R.

Thus, a main controller detects a voltage variation (Δ(LDC) of the internal capacitor C in step S103, detects a voltage variation (Δ(MCU)) of the internal capacitor C1 in step S104, and then compares the two detected voltage variation values with each other in step S105.

It is determined in step S106 whether the detected main voltage values are equal to each other. If the voltage values are not equal to each other, it is determined in step S109 that the high-voltage relay Ry4 connected to the power line is normal.

However, if the voltage values are equal to each other, it is determined in step S107 that the periphery complementary apparatus uses the voltage of the internal capacitor C1 of the motor controller due to the fusion of the high-voltage relay Ry4 connected to the power line of the motor controller.

As described above, if it is determined that the fusion of the high-voltage relay Ry4 connected to the power line occurs, a diagnostic code is stored in a memory such that a driver can rapidly exchange the relay.

The method of diagnosing a relay contact according to the related art is performed when the ignition is shut down through a separated electric component (LDC; low voltage DC-DC converter) in order to detect a fusion of a relay.

However, the method of diagnosing a relay contact according to the related art requires the connection with the separated electric component (LDC) and is performed upon the shutdown. When the separated electric component is out of order upon the shutdown, the relay diagnosis is not normally performed, so that a driver may be subject to the dangerous situation.

SUMMARY

The embodiment provides an apparatus for diagnosing a relay contact which can diagnose the relay contact using only a motor controller without a separated electric component and a method thereof.

The embodiment provides an apparatus for diagnosing a relay contact, capable of preventing an emergency situation due to malfunction of vehicular components by diagnosing the relay contact state upon the ignition-on state other than the shutdown state.

Meanwhile, the objects accomplished by the embodiments may not be limited to the above object, and those skilled in the art can clearly understand other objects from following description.

According to the embodiment, there is provided a method of diagnosing a relay contact of an electric vehicle. The method includes measuring a first voltage input from a high-voltage battery to an inverter; comparing the first voltage with a second voltage output through the high-voltage battery; identifying a detection time point of the first voltage when the first voltage is greater than the second voltage; and determining whether a high-voltage relay, which intermits an output voltage of the high-voltage battery, is malfunctioned based on the identified detection time point.

According to the embodiment, there is provided an apparatus for diagnosing a relay contact of an electric vehicle. The apparatus includes a high-voltage battery serving as a main power source; an inverter receiving a DC (direct current) electrical power from the high-voltage battery and driving a motor by changing a phase of the DC electrical power; and a high-voltage relay between the high-voltage battery and the inverter, the high-voltage relay intermitting the DC electrical power output through the high-voltage battery, wherein the inverter determines whether the high-voltage relay is malfunctioned based on a time point at which a DC link voltage value according to the supplying of the DC electrical power is equal to or greater than a voltage value of the high-voltage battery and intermits a power input to the motor according to a diagnosis result.

According to the embodiment, it is diagnosed whether the high-voltage relay installed on the power line of the electric vehicle is fused and the diagnosis result is indicated to the driver, so that a rapid repair or exchange can be performed before driving the vehicle, thereby improving stability and reliability.

According to the embodiment, an inverter may diagnose the fusion of a relay without interworking with other electric components so that a user may take necessary measures against a dangerous situation based on the fusion state of the relay.

Further, according to the embodiment, it is diagnosed upon the ignition-on state of the electric vehicle whether the relay is fused, so that the electric vehicle can be prevented from being driven at the fusion state of the electric vehicle.

DETAILED DESCRIPTION OF THE EMBODIMENTS

The principle of the embodiments will be described below. Therefore, although not specifically described and depicted in the specification, a person having the ordinary skill in the art may realize the principle of the embodiments and may invent various apparatuses within the concept and scope of the embodiments. Further, in principle, conditional terms and embodiments mentioned in the specification shall be obviously intended to understand the concept of the embodiments and may not limit the scope of the embodiments.

Further it shall be understood that all detailed descriptions, which teach a specific embodiment as well as a principle, an aspect and embodiments, are intended to include structural and functional equivalents. Further, it should be understood that the equivalents may include equivalents to be developed in the future as well as known equivalents and may include all devices invented for performing the same functions regardless of the structure thereof.

According to the embodiment, an inverter may diagnose the fusion of a relay without interworking with other electric components so that a user may take necessary measures against a dangerous situation based on the fusion state of the relay.

Figure 1:
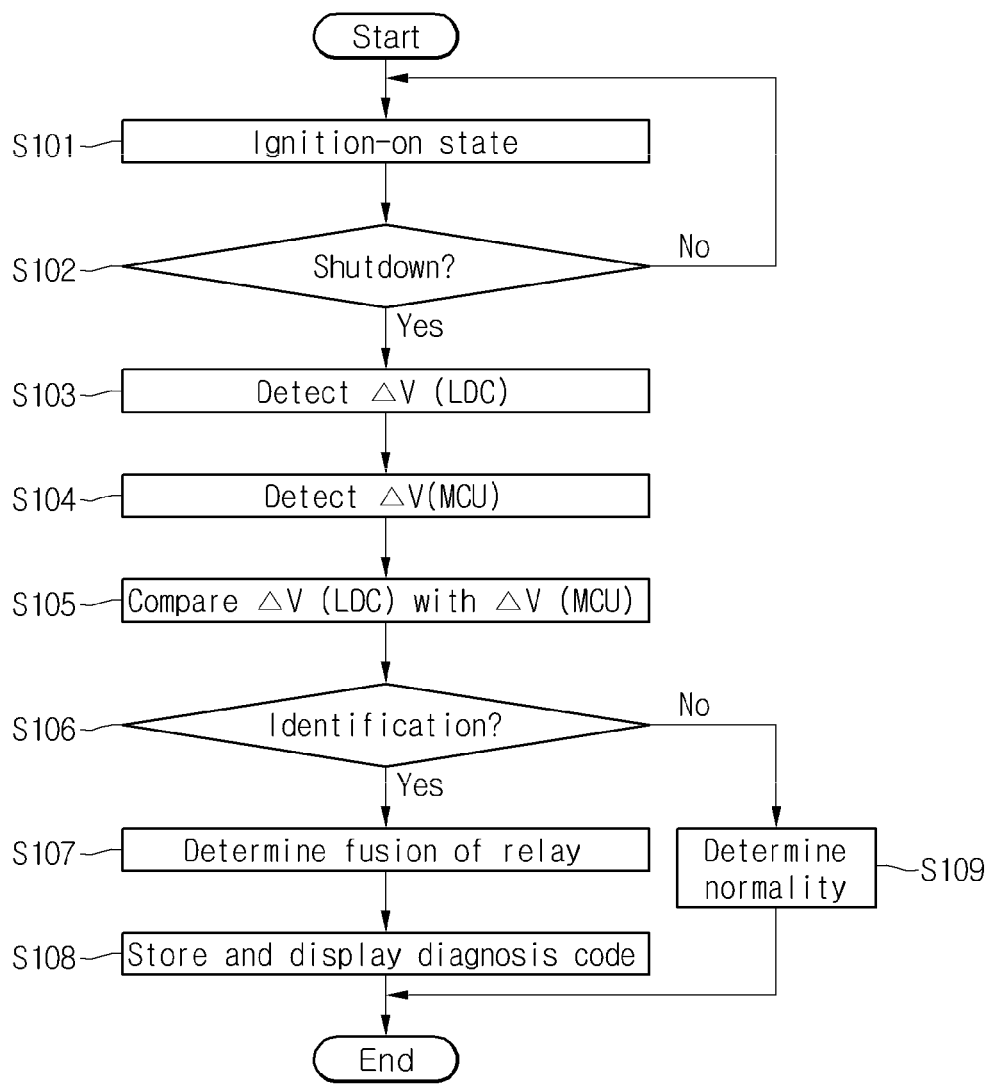
FIG. 1 is a flowchart illustrating a method of diagnosing a relay contact point according to the related art.
Figure 2:
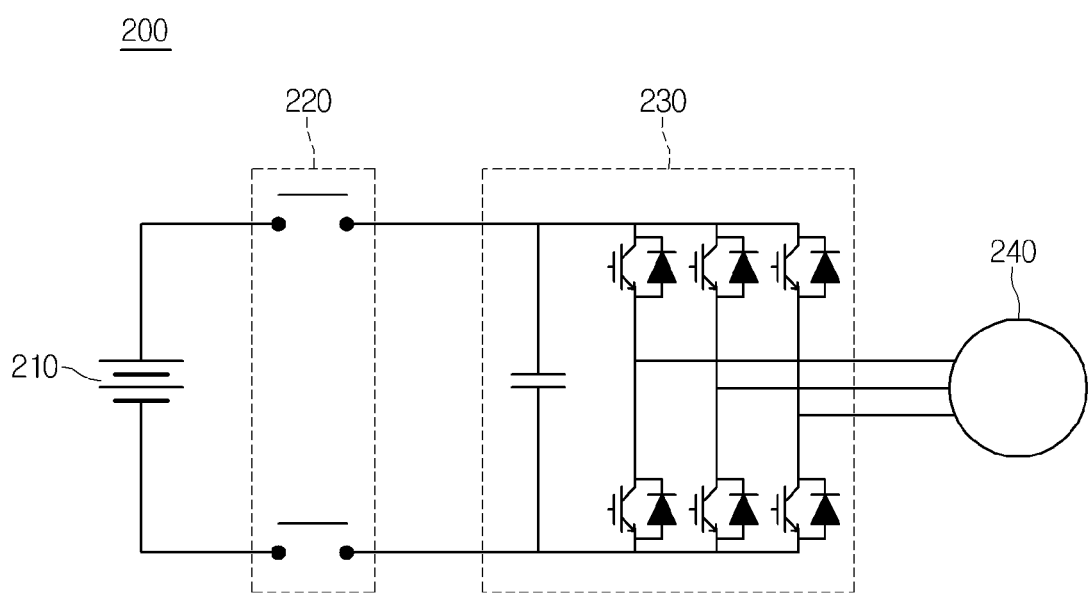
FIG. 2 is a circuit diagram showing an electric vehicle according to the embodiment.

FIG. 2 is a circuit diagram showing an electric vehicle according to the embodiment.

Referring to FIG. 2, the electric vehicle 200 includes a high-voltage battery 210, a high-voltage relay 220, an inverter 230 and a motor 240.

The high-voltage battery 210 supplies a driving electrical power to the electric vehicle 200. Specifically, the high-voltage battery 210 supplies a DC electrical power to a capacitor C in the electric vehicle 200.

The high-voltage battery 210 may include a set of a plurality of unit cells. The unit cells may be managed by a BMS (Battery Management System) in order to maintain a constant voltage. Thus, the unit cells may output the constant voltage by the BMS.

For example, the BMS may detect a voltage of the high-voltage battery 210 and may transfer the detected voltage to an electronic control unit (not shown) or the inverter in the electric vehicle 200. The BMS may supply a DC electrical power stored in a capacitor of the electric vehicle to the battery when the battery voltage is dropped down below a lower limit value. Further, when the battery when the battery voltage is increased to or over an upper limit value, a DC electrical power may be supplied to the capacitor C of the electric vehicle 200.

Preferably, the high-voltage battery 210 includes a secondary battery which is capable of being charged or discharged, but the embodiment is not limited thereto.

The high-voltage relay 220 is connected to a predetermined power line connected to the high-voltage battery 210, such that the high-voltage relay 220 intermits the DC electrical power output through the high-voltage battery 210.

Specifically, the high-voltage relay 220 may include first and second high-voltage relays 220. The first high-voltage relay is connected to a positive terminal of the high-voltage battery 210 such that a DC power source is intermitted. The second high-voltage relay is connected to a negative terminal of the high-voltage battery 210 such that the DC power source is intermitted.

The DC electrical power is provided from the high-voltage battery 210 to the inverter 230 according to a state of the high-voltage relay 220. The inverter 230 converts the DC electrical power into an AC electrical power and provides the AC electrical power to the motor 240. Preferably, the AC electrical power converted by the inverter 230 includes a three-phase AC electrical power.

The inverter 230 provides the three-phase AC electrical power to the motor 240 through a three-phase cable. The three-phase cable may be composed of separated three cables. To the contrary, three cables may be included in a single three-phase cable.

Specifically, the inverter 230 includes an IGBT (Insulated Gate Bipolar Transistor) and executes a PWM (Pulse Width Modulation) switching operation according to a control signal applied thereto by a control unit which will be described below, such that a phase of the electrical power supplied to the high-voltage battery 210 is converted to drive the motor 240.

The motor 240 includes a stator (not shown), which is in a stationary state without rotation, and a rotor (not shown) rotating. The motor 240 receives AC voltage that is supplied through the inverter 230. For example, the motor 240 may be a three-phase motor. When each phase AC electrical power, which has a variable voltage/frequency, is applied to each stator coil in each phase, a rotation speed of the rotor varies depending on the applied frequency.

The motor 240 may include various types of motors such as an induction motor, a BLDC (blushless DC) motor, or a reluctance motor.

Meanwhile, the motor 240 may be provided at one side thereof with a driving gear (not shown). The driving gear converts the rotational energy of the motor 240 according to a gear ratio. The rotational energy of the driving gear is transferred to a front wheel and/or a rear wheel so that the electric vehicle 200 moves.

Meanwhile, although not shown, the electric vehicle may further include an electronic controller to control whole electronic devices of the electric vehicle. The electronic controller (not shown) controls the operation and the displaying of each device. The electronic controller (not shown) may control the BMS.

In addition, the electronic controller may generate a driving instruction value according to various operation modes (driving mode, rearward mode, neutral mode, and parking mode) based on detection signals transferred from an inclination angle detector (not shown) to detect the inclination angle of the electric vehicle, a speed detector (not shown) to detect the speed of the electric vehicle, a brake detector (not shown) according to the operation of a brake pedal, or an acceleration detector according to the operation of an acceleration pedal. In this case, for example, the driving instruction value may include a torque instruction value or a speed instruction value.

Meanwhile, the electric vehicle 200 according to one embodiment may include a pure electric vehicle employing a battery and a motor, and a hybrid electric vehicle employing a battery and a motor together with an engine.

In this case, the hybrid electric vehicle may include a switching unit to select at least one of the battery and the engine, and a transmission. Meanwhile, the hybrid electric vehicle is classified into a series hybrid electric vehicle, which converts mechanical energy output from an engine into electrical energy to drive the motor, and a parallel hybrid electric vehicle which uses both of the mechanical energy output from the engine and the electrical energy output from the battery.

Figure 3:
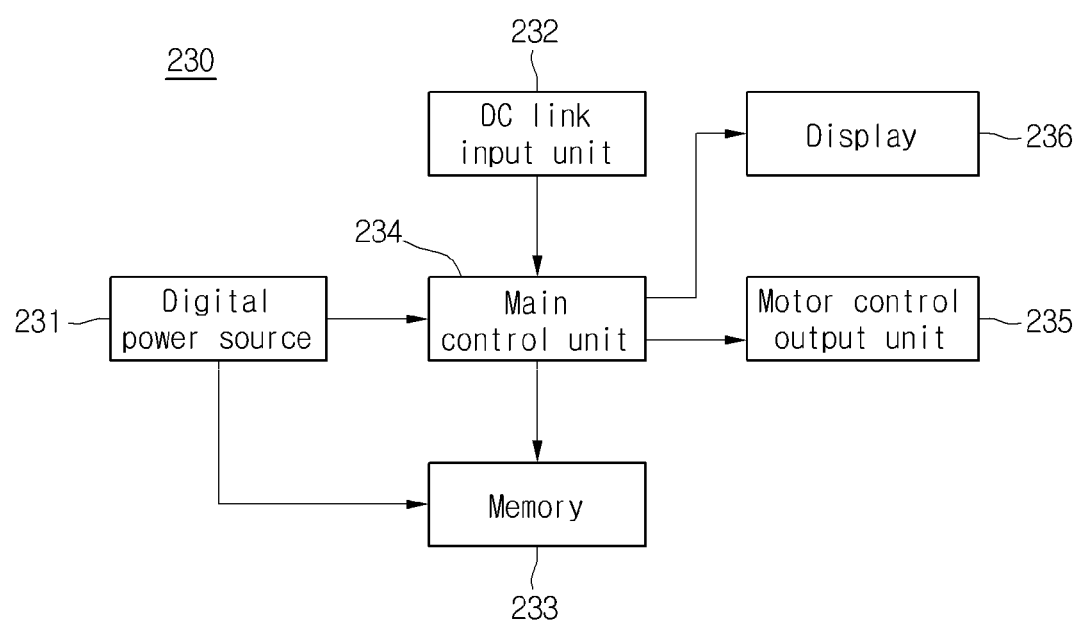
FIG. 3 is a block diagram showing in detail the inverter depicted in FIG. 2.

FIG. 3 is a block diagram showing in detail the inverter depicted in FIG. 2.

The contact diagnosis technique according to the embodiment will be described with reference to FIG. 3.

Referring to FIG. 3, the inverter 230 includes a digital power source 231, a DC link input unit 232, a memory 233, a main control unit 234, a motor control output unit 235 and a display 236.

The digital power source 231 allows a DC electrical power supplied through the high-voltage battery 210 to be dropped down so that a driving electric power is provided to the main control unit 234 and the memory 233.

The digital power source 231 may be a DC-DC converter. That is, the digital power source 231 which is a low DC/DC converter, converts the high voltage supplied from the high-voltage battery 210 into a low voltage and provides the low voltage to various electronic components mounted on the electric vehicle 200.

The DC link input unit 232, which is an input of the DC electrical power, is connected to the high-voltage battery 210, so that the DC link input unit 232 receives the high-voltage DC electrical power provided from the high-voltage battery 210.

Data, which are required to operate the inverter 230 and data which are generated while the inverter 230 is operated, are stored in the memory 233. The memory 233 may be implemented with a memory medium such as EEPROM.

Specifically, the memory 233 stores diagnosis information about a result of a diagnosis performed while the inverter 230 is operated.

The main control unit 234 controls the overall operation related to the voltage generation of the high-voltage battery 210 and controls the overall operation of the electric vehicle 200 the high-voltage relay 220 by controlling the high-voltage relay 220 and the inverter 230.

At the time point at which the electric vehicle 200 is turned on, the main controller 234 controls the operation of the high-voltage relay 220 to allow the high-voltage battery 210 to output the DC electrical power to the inverter 230.

At the time point at which the electric vehicle 200 is turned off, the main controller 234 controls the operation of the high-voltage relay 220 to block the electrical power output to the inverter 230.

That is, at the time point at which the electric vehicle 200 is turned on, the main controller 234 compares the first voltage input to the DC link input unit 232 with the second voltage output through the high-voltage battery 210 to diagnose the contact state of the high-voltage relay 220.

That is, at the time point at which the electric vehicle 200 is turned on, the main controller 234 allows the high-voltage relay 220 to be turned on to allow the DC electrical power charged in the high-voltage battery 210 to be provided to the inverter 230.

In this case, the main controller 234 compares the levels of the first voltage input to the DC link input unit 232 and the second voltage output through the high-voltage battery 210 with each other, and diagnoses whether the high-voltage relay 220 is fused based on the comparison result.

That is, when the high-voltage relay 220 is turned on, the DC electrical power charged in the high-voltage battery 210 is provided to the inverter 230. In this case, the DC electrical power, which is initially provided to the inverter 230 (at the time point at which the high-voltage relay 220 is turned on), has the first voltage lower than the second voltage.

When a time which is taken enough to stabilize the voltage is elapsed, the DC electrical power input to the inverter 230 is consistent with the DC electrical power output through the high-voltage battery 210.

In other words, before the voltage is stabilized, the first voltage input to the inverter 230 is lower than the second voltage output through the high-voltage battery 210, and the first and second voltages are maintained at the same level while the voltage is being stabilized.

However, when a fault of a contact point is caused due to the fusion of the high-voltage relay 220, before the voltage is stabilized, the first voltage is equal to the second voltage.

This signifies that even before the electric vehicle 200 is turned on, due to the fusion of the high-voltage relay 220, the DC electrical power charged in the high-voltage battery 210 is continuously applied to the inverter 230.

Thus, the main control unit 234 diagnoses whether the high-voltage relay 220 is fused based on the time point at which the first voltage is equal to or higher than the second voltage.

If the time point at which the first voltage is equal to or higher than the second voltage occurs on or after the time point of stabilization, the main control unit 234 determines that the high-voltage relay 220 is normal.

However, if the time point at which the first voltage is equal to or higher than the second voltage occurs before the time point of stabilization, the main control unit 234 determines that the high-voltage relay 220 is fused so that necessary measures may be followed according to the determination result.

That is, when the main control unit 234 determines that the high-voltage relay 220 is normal, the main control unit 234 outputs a control signal to the motor control output unit 235 such that a driving electrical power is provided to the motor 240.

However, when the main control unit 234 determines that the high-voltage relay 220 is fused, the main control unit 234 allows the motor 240 to be stopped (the electrical power supplied to the motor is blocked) and then, stores the diagnosis information about the fusion of the high-voltage relay 220.

Further, the main control unit 234 displays the information about necessary measures against the fusion of the high-voltage relay 220 on the display 236. Thus, the display 236 informs a driver of the information provided from the main control unit 234 about the fusion of the high-voltage relay 220. The display 236 may be provided on a cluster.

Figure 4:
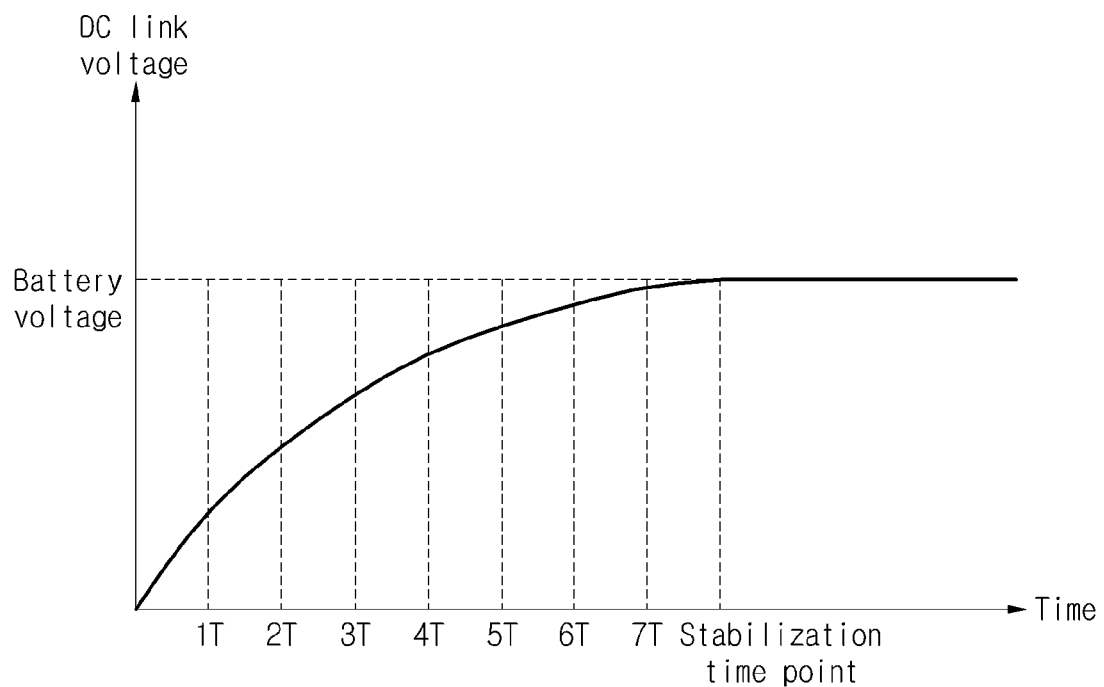
FIG. 4 is a graph illustrating a voltage variation in a normal operation according to the embodiment.

FIG. 4 is a graph illustrating a voltage variation in a normal operation according to the embodiment.

Referring to FIG. 4, the first voltage (DC link voltage) input to the inverter 230 is gradually increased from the time point at which the electric vehicle is turned on at the state that the high-voltage relay 220 is normally operated.

That is, as time elapses from the first time point 1T to the seventh time point 7T, the first voltage is gradually increased. In this case, the first voltage is gradually increased in the lower range than the second voltage (battery voltage).

Then, when it reaches the time point of the voltage stabilization as time elapses, the first voltage may be equal to the second voltage.

Figure 5:
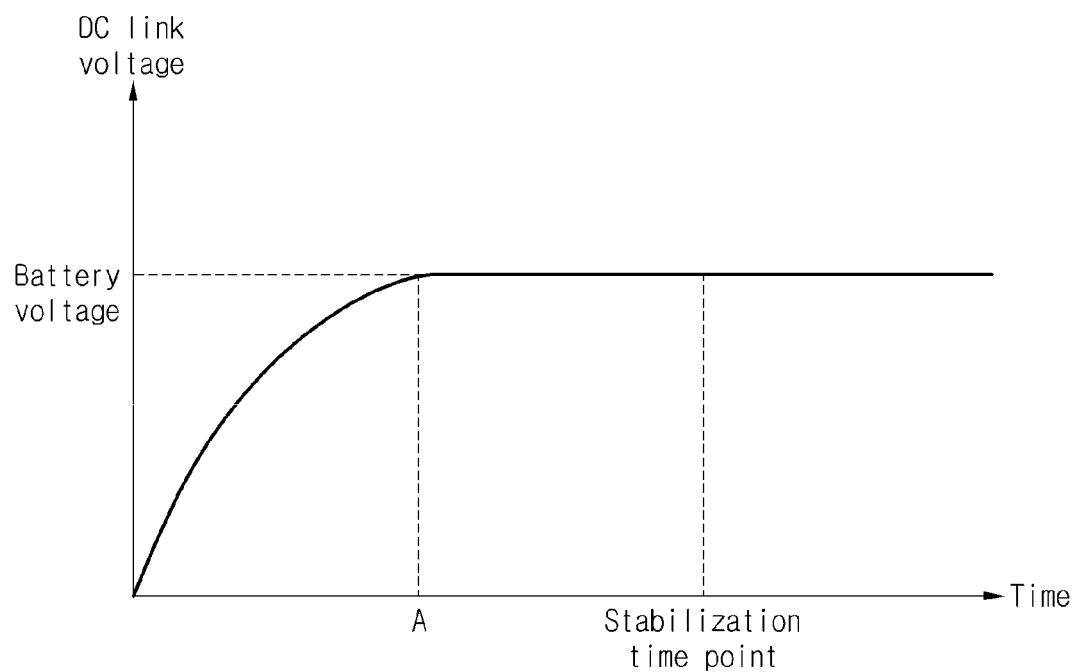
FIG. 5 is a graph illustrating a voltage variation in an abnormal operation according to the embodiment.

FIG. 5 is a graph illustrating a voltage variation in an abnormal operation according to the embodiment.

Referring to FIG. 5, the first voltage (DC link voltage) input to the inverter 230 is abruptly increased from the time point at which the electric vehicle is turned on at the state that the high-voltage relay 220 is abnormally operated. This signifies that the DC electrical power is continuously supplied to the inverter 230 even before the electrical vehicle 200 is started.

As time elapses, the first voltage arrives at the same level as that of the second voltage in advance of the time point at which the voltage is stabilized.

That is, the voltage output from the inverter 230 has the same level as that of the voltage supplied from the high-voltage battery 210 before the voltage is stabilized.

Thus, in the embodiment, based on the time points that the first voltage is equal to or higher than the second voltage and the voltage is stabilized, it is diagnosed whether the high-voltage relay 220 is fused and according to the diagnosis result, the driving voltage is selectively supplied to the motor 240.

According to the embodiment, it is diagnosed whether the high-voltage relay installed on the power line of the electric vehicle is fused and the diagnosis result is indicated to the driver, so that a rapid repair or exchange can be performed before driving the vehicle, thereby improving stability and reliability.

According to the embodiment, the inverter may diagnose the fusion of a relay without interworking with other electric components so that a user may take necessary measures against a dangerous situation based on the fusion state of the relay.

Further, according to the embodiment, when the electric vehicle is ignited, it is diagnosed whether the relay is fused, so that the electric vehicle can be prevented from being driven at the fusion state of the electric vehicle.

Figure 6:
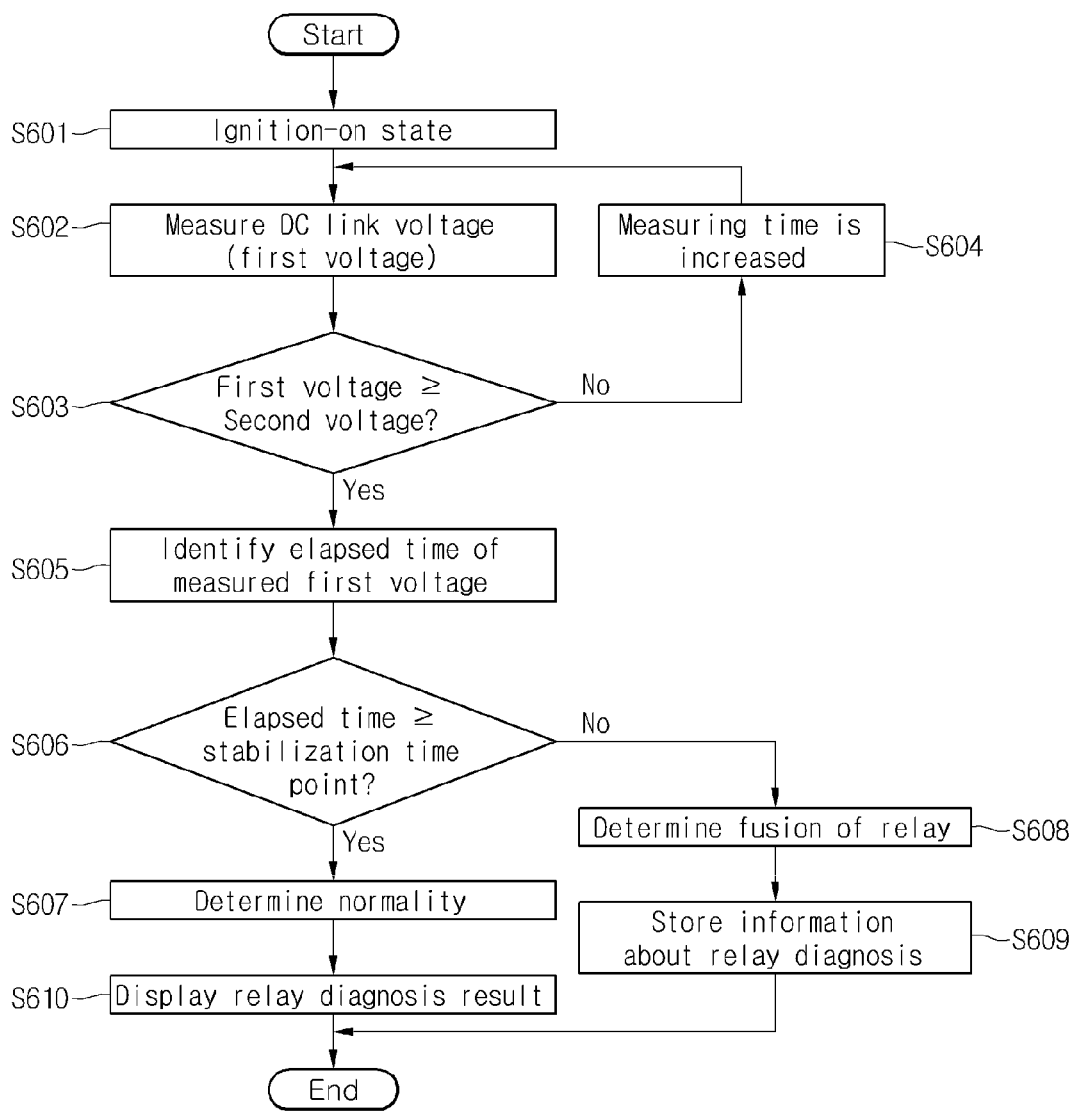
FIG. 6 is a flowchart illustrating a method of diagnosing a relay contact step by step according to the embodiment.

FIG. 6 is a flowchart illustrating a method of diagnosing a relay contact step by step according to the embodiment.

In step S601, the electric vehicle 200 is in the ignition-on state. At this time point, the electric vehicle is turned on by a driver.

Then, in the step S602, the main control unit 234 measures the DC link voltage (first voltage) input to the inverter 230 according to the DC electrical power output through the high-voltage battery 210 at the time point at which the electric vehicle 200 is turned on.

In step S603, when the first voltage is measured, the main control unit 234 compares the first voltage with the second voltage output through the high-voltage battery 210 to determine whether the first voltage is equal to or higher than the second voltage. That is, the main control unit 234 determines whether the first voltage is equal to or higher than the second voltage.

As a determination result in step S603, when the first voltage is lower than the second voltage, the main control unit 234 determines in step S604 that a current time point is before a time point at which the voltage is stabilized. In other words, when the first voltage is lower than the second voltage, the main control unit 234 is on standby for a predetermined time. Then, after the predetermined time ΔT elapses, the main control unit 234 returns to step S602 such that the first voltage is measured again.

Meanwhile, as the determination result in step S603, when the first voltage is equal to or higher than the second voltage, the main control unit 234 identifies the time point at which the first voltage is measured in step S605. In other words, when the first voltage is equal to or higher than the second voltage, the main control unit 234 identifies an elapsed time from the ignition-on time point to the current time point.

In step S606, the main control unit 234 determines whether the measured time point is on or before the time point of the predetermined voltage stabilization. That is, the main control unit 234 determines whether the time point at which the first voltage is equal to or higher than the second voltage occurs on or before the time point of the stabilization.

In step S607, when the first voltage reaches the same level as or higher than that of the second voltage after the stabilization time point, the main control unit 234 determines that the high-voltage relay 220 is normal.

However, in step S608, when the first voltage is increased at the same level as or higher than that of the second voltage before the stabilization time point, the main control unit 234 determines that the high-voltage relay 220 is fused.

In step S609, the main control unit 234 stores diagnosis information about the fusion of the high-voltage relay 220 in the memory 233.

In step S610, the main control unit 234 allows the information about the result of diagnosing the high-voltage relay 220 to be displayed.

According to the embodiment, it is diagnosed whether the high-voltage relay installed on the power line of the electric vehicle is fused and the diagnosis result is indicated to the driver, so that a rapid repair or exchange can be performed before driving the vehicle, thereby improving stability and reliability.

According to the embodiment, the inverter may diagnose the fusion of a relay without interworking with other electric components so that a user may take necessary measures against a dangerous situation based on the fusion state of the relay.

Further, according to the embodiment, it is diagnosed upon the ignition-on state of the electric vehicle whether the relay is fused, so that the electric vehicle can be prevented from being driven at the fusion state of the electric vehicle.

The above image processing method according to the embodiment may be prepared as a program for executing the method in the computer to be stored in the computer-readable recording medium and examples of the computer-readable recording medium include a ROM, a RAM, a CD-ROM, a magnetic tape, a floppy disk, an optical data storage, and the like and in addition, include a type of a carrier wave (e.g., transmission through the Internet).

The computer-readable recording media are distributed on computer systems connected through the network, and thus the computer-readable recording media may be stored and executed as the computer-readable code by a distribution scheme. In addition, functional programs, codes, and code segments for implementing the method can be easily deduced by programmer skilled in the art.

Further, as described above, although various examples have been illustrated and described, the present disclosure is not limited to the above-mentioned examples and various modifications can be made by those skilled in the art without departing from the scope of the appended claims. In addition, these modified examples should not be appreciated separately from technical spirits or prospects.

What is claimed is:

1. A method of diagnosing a relay contact of an electric vehicle, the method comprising:
   measuring a first voltage input from a high-voltage battery to an inverter;
   comparing the first voltage with a second voltage output through the high-voltage battery;
   identifying a detection time point of the first voltage when the first voltage is greater than the second voltage; and
   determining whether a high-voltage relay, which intermits an output voltage of the high-voltage battery, is malfunctioned based on the identified detection time point.

2. The method of claim 1, wherein the measuring of the first voltage is performed at a time point of ignition-on of the electric vehicle, and
   the detection time point is a lapse time from the time point of ignition-on to the time point at which the first voltage is detected.

3. The method of claim 1, further comprising:
   comparing the detection time point with a time point of stabilizing a voltage input to the inverter when the detected time point is identified.

4. The method of claim 3, wherein the determining of the malfunction of the high-voltage relay comprises:
   determining that the high-voltage relay is normal when the detection time point occurs on or after the stabilization time point.

5. The method of claim 3, wherein the determining of the malfunction of the high-voltage relay comprises:
   determining that a fusion is caused in the high-voltage relay when the detection time point occurs before the stabilization time point.

6. The method of claim 5, further comprising:
   storing diagnosis information about the fusion of the high-voltage relay when the fusion of the high-voltage relay is determined.

7. The method of claim 5, further comprising:
   displaying diagnosis information about the fusion of the high-voltage relay when the fusion of the high-voltage relay is determined.

8. The method of claim 1, further comprising:
   measuring again the first voltage input from the inverter after a predetermined time is elapsed when the first voltage is lower than the second voltage.

9. An apparatus for diagnosing a relay contact of an electric vehicle, the apparatus comprising:
   a high-voltage battery serving as a main power source;
   an inverter receiving a DC (direct current) electrical power from the high-voltage battery and driving a motor by changing a phase of the DC electrical power; and
   a high-voltage relay between the high-voltage battery and the inverter, the high-voltage relay intermitting the DC electrical power output through the high-voltage battery,
   wherein the inverter determines whether the high-voltage relay is malfunctioned based on a time point at which a DC link voltage value according to the supplying of the DC electrical power is equal to or greater than a voltage value of the high-voltage battery and intermits a power input to the motor according to a diagnosis result.

10. The apparatus of claim 9, wherein the inverter comprises:
    a DC link input unit receiving the DC link voltage output through the high-voltage battery;
    a main control unit receiving a DC link voltage value input through the DC link input unit and diagnosing whether the high-voltage relay is malfunctioned based on a time point at which the DC link voltage value is equal to or greater than a voltage value of the high-voltage battery and a time point at which the DC link voltage is stabilized; and
    a motor control unit selectively supplying an electrical power to the motor according to a diagnosis result of the main control unit.

11. The apparatus of claim 10, wherein the main control unit detects the first voltage at a time point of ignition-on of the electric vehicle and diagnoses whether the high-voltage relay is malfunctioned based on a lapse time from the time point of ignition-on to a time point at which the DC link voltage having a value equal to or greater than the voltage value of the high-voltage battery is detected.

12. The apparatus of claim 11, wherein the main control unit determines that the high-voltage relay is normal when the detection time point occurs on or after the stabilization time point, and determines that a fusion is caused in the high-voltage relay when the detection time point occurs before the stabilization time point.

13. The apparatus of claim 12, wherein the inverter further comprises:
    a memory storing diagnosis information about the fusion of the high-voltage relay when the fusion of the high-voltage relay is determined; and
    a display unit displaying diagnosis information about the fusion of the high-voltage relay when the fusion of the high-voltage relay is determined.

* * * * *